(12) United States Patent
Suzuki

(10) Patent No.: US 9,703,212 B2
(45) Date of Patent: Jul. 11, 2017

(54) EXPOSURE APPARATUS

(71) Applicant: Kabushiki Kaisha Toshiba, Minato-ku (JP)

(72) Inventor: Masaru Suzuki, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/735,256

(22) Filed: Jun. 10, 2015

(65) Prior Publication Data

US 2016/0266504 A1 Sep. 15, 2016

Related U.S. Application Data

(60) Provisional application No. 62/132,185, filed on Mar. 12, 2015.

(51) Int. Cl.
*G03B 27/52* (2006.01)
*G03F 7/20* (2006.01)

(52) U.S. Cl.
CPC ...... *G03F 7/70875* (2013.01); *G03F 7/70425* (2013.01); *G03F 7/70783* (2013.01)

(58) Field of Classification Search
CPC ............ H01L 21/6831; H01L 21/6833; H01L 21/67248; H01L 21/67288; G03F 7/70341; G03F 7/7085; G03F 7/70433; G03F 7/70425; G03F 7/70516; G03F 7/70525; G03F 7/70533; G03F 7/707; G03F 7/70716; G03F 7/70725; G03F 7/70775; G03F 7/70783; G03F 7/70858; G03F 7/70866; G03F 7/70875

USPC ......... 355/30, 52, 53, 55, 67–77; 250/492.1, 250/492.2, 492.22, 493.1, 548; 430/5, 8, 430/22, 30, 311, 312
See application file for complete search history.

(56) References Cited

U.S. PATENT DOCUMENTS 5,134,436 A * 7/1992 Fujioka ............... G03F 7/70425
355/30
6,590,633 B1 * 7/2003 Nishi .................. G03F 7/70358
269/21

(Continued)

FOREIGN PATENT DOCUMENTS

JP 5-315222 11/1993
JP 7-283109 A 10/1995

(Continued)

OTHER PUBLICATIONS

English translation of JP 07-283109, published on Oct. 27, 1995.*

(Continued)

*Primary Examiner* — Christina Riddle
(74) *Attorney, Agent, or Firm* — Oblon, McClelland, Maier & Neustadt, L.L.P.

(57) ABSTRACT

According to one embodiment, an exposure apparatus includes a wafer stage, an irradiation optical system, and a projecting optical system. The wafer stage includes a wafer clamp, and a plate clamp configured to hold a silicon plate having a predetermined film formed on a silicon substrate. A plurality of sensors configured to measure a back surface temperature of the silicon plate is placed on an upper surface side of the plate clamp. The projecting optical system applies exposure light to the silicon plate on the plate clamp upon exposure of the silicon plate.

7 Claims, 12 Drawing Sheets

(56) References Cited

U.S. PATENT DOCUMENTS

| | | | | |
|---|---|---|---|---|
| 2005/0136346 A1* | 6/2005 | Ottens | ............... | G03F 7/70616 |
| | | | | 430/30 |
| 2005/0213067 A1* | 9/2005 | Van Der Feltz | .... | G03F 7/70875 |
| | | | | 355/67 |
| 2006/0082744 A1* | 4/2006 | Hirukawa | .......... | G03F 7/70258 |
| | | | | 355/30 |
| 2007/0257209 A1* | 11/2007 | Ottens | ............... | G03F 7/70616 |
| | | | | 250/492.3 |
| 2009/0153813 A1* | 6/2009 | Shiraishi | ........... | G03F 7/70341 |
| | | | | 355/30 |
| 2009/0279059 A1* | 11/2009 | Shirata | .............. | G03F 7/70341 |
| | | | | 355/30 |
| 2014/0127628 A1* | 5/2014 | Fujimura | ........... | H01J 37/3174 |
| | | | | 430/296 |

FOREIGN PATENT DOCUMENTS

| JP | 10-189424 | 7/1998 |
|---|---|---|
| JP | 2011-18942 A | 1/2011 |
| JP | 2011-222610 | 11/2011 |

OTHER PUBLICATIONS

Office Action issued on Jun. 10, 2016 in Korean Patent Application No. 10-2015-0119281 with English translation.
Office Action issued Nov. 18, 2016 in Korean Patent Application No. 10-2015-0119281 (with English language translation).
Office Action issued Oct. 26, 2016 in Taiwanese Patent Application No. 104127053 (with English language translation).

* cited by examiner

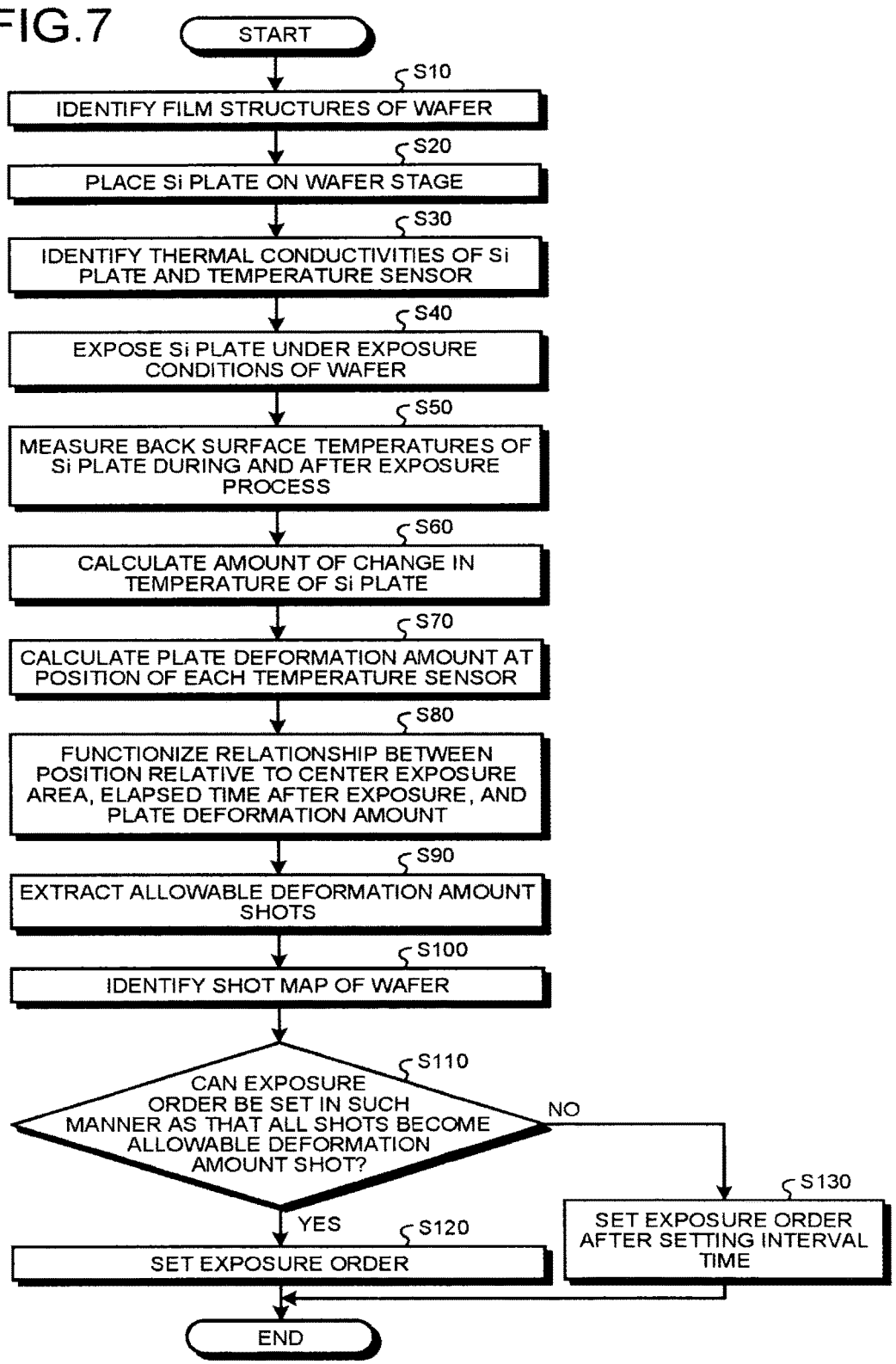

EXPOSURE APPARATUS

CROSS-REFERENCE TO RELATED APPLICATIONS

This application is based upon and claims the benefit of priority from U.S. Provisional Application No. 62/132,185, filed on Mar. 12, 2015; the entire contents of which are incorporated herein by reference.

FIELD

Embodiments described herein relate generally to an exposure apparatus, a wafer stage, and an exposure order setting device.

BACKGROUND

The wavelength of exposure light used by an exposure apparatus has become shorter in recent years. An EUV exposure apparatus that uses extreme ultraviolet light (Extreme Ultraviolet Light: hereinafter abbreviated to EUV light) is on its way to being applied to the manufacture of a semiconductor device. In the EUV exposure apparatus, the EUV light is attenuated in the atmosphere. Accordingly, exposures are performed in a vacuum chamber.

When exposed in the vacuum chamber, a wafer is provided with energy from the EUV light and the like to generate heat. However, an object in a vacuum has a little amount of heat dissipation. There is a method in which a cooling mechanism is provided on an electrostatic chuck side that is in contact with the back surface side of the wafer as a method for dissipating energy. In the cooling mechanism, gas such as $H_2$ is passed between the back surface of the wafer and the electrostatic chuck to release the heat of the wafer to the electrostatic chuck side.

However, if the output of a light source of EUV light is increased, even the cooling mechanism does not provide sufficient cooling. If cooling is not sufficiently provided, the wafer deforms. Accordingly, alignment accuracy and the like are reduced. Especially, due to the thermal effect of a shot that is being exposed, a thermal effect on an adjacent shot also occurs. Hence, an exposure process that suppresses the deformation of the wafer is desired.

BRIEF DESCRIPTION OF THE DRAWINGS

FIG. 7 is a flowchart illustrating a procedure for an exposure order setting process according to the embodiment;

DETAILED DESCRIPTION

According to the present embodiment, an exposure apparatus is provided. The exposure apparatus includes a wafer stage on which a wafer is mounted, an irradiation optical system that applies exposure light to a reticle, and a projecting optical system that guides the exposure light onto the wafer stage. The wafer stage includes a wafer clamp that holds the wafer, and a plate clamp that holds a silicon plate having a predetermined film formed on a silicon substrate. Furthermore, a plurality of temperature sensors that measures a back surface temperature of the silicon plate is placed on the upper surface side of the plate clamp. The projecting optical system applies the exposure light to the silicon plate on the plate clamp upon the exposure of the silicon plate. Moreover, the projecting optical system applies the exposure light to the wafer on the wafer clamp upon the exposure of the wafer.

Exemplary embodiments of an exposure apparatus, a wafer stage, and an exposure order setting device will be explained below in detail with reference to the accompanying drawings. The present invention is not limited to the following embodiment.

(Embodiment)

Figure 1:
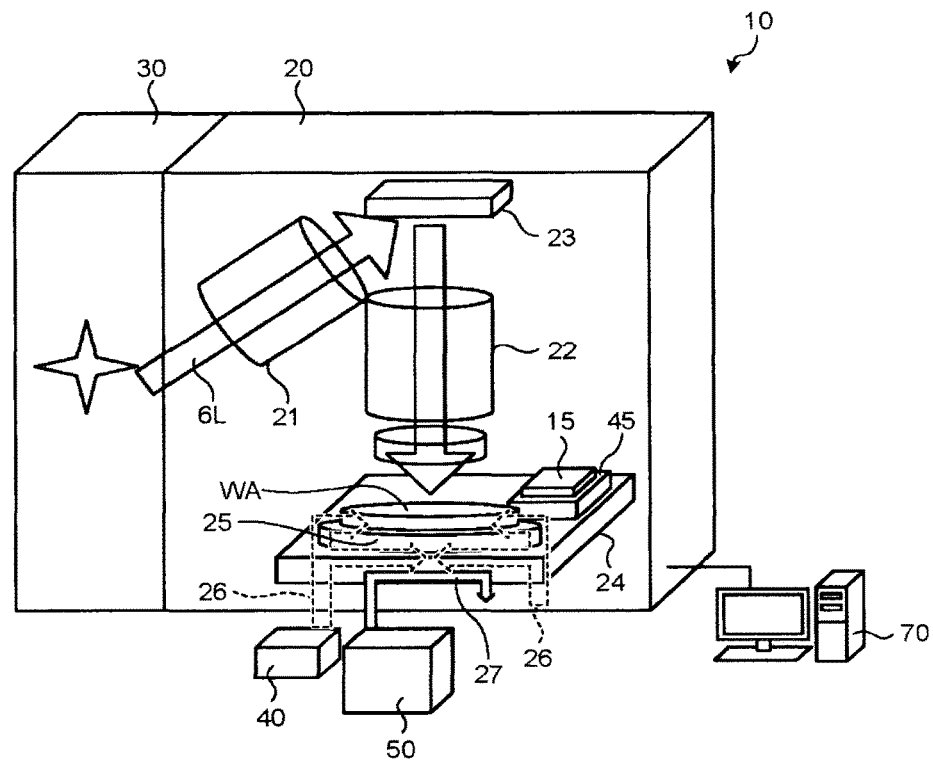
FIG. 1 is a diagram illustrating the configuration of an exposure apparatus according to an embodiment.

FIG. 1 is a diagram illustrating the configuration of an exposure apparatus according to an embodiment. An exposure apparatus 10 is an apparatus that performs a scan exposure in a shot while applying exposure light to, for example, a scan area having a predetermined shape.

The exposure apparatus 10 includes a vacuum chamber 20, a light source 30, and a control apparatus 70. Moreover, the exposure apparatus 10 includes a cooling gas supply tank 40, and a coolant supply tank 50.

The light source 30 emits exposure light 6L and sends the exposure light 6L into the vacuum chamber 20. The exposure light 6L is, for example, extreme ultraviolet light (Extreme Ultraviolet Light: hereinafter abbreviated to EUV light) of a wavelength of approximately 100 nm or below.

The vacuum chamber 20 is a chamber that is evacuated when a substrate such as a wafer WA is exposed. In the vacuum chamber 20, an illuminating optical system 21, a projecting optical system 22, a wafer stage 24, and the like are placed. Moreover, in the vacuum chamber 20, a reticle stage (not illustrated), a cooling gas pipe (not illustrated), a coolant pipe (not illustrated), and the like are placed.

Both the illuminating optical system 21 and the projecting optical system 22 are reflective optical systems. For example, the illuminating optical system 21 and the projecting optical system 22 include a plurality of mirrors. A wafer clamp 25, a Si plate 15 comprising plate-shaped silicon, and a plate clamp 45 are placed on the wafer stage 24 of the embodiment.

The wafer clamp 25 holds the wafer WA with an electrostatic chuck. The plate clamp 45 holds the Si plate 15 with an electrostatic chuck. The plate clamp 45 has a similar structure (such as thermal conductivity) to the wafer clamp 25.

The Si plate 15 comprises a similar material to the wafer WA, and is provided on its back surface side with a plurality of temperature sensors. The temperature sensor measures the temperature on the back surface of the Si plate 15 when the exposure light 6L is applied to the Si plate 15. The back surface temperature measured by the temperature sensor is transmitted to the control apparatus 70.

The control apparatus 70 is a computer that controls the exposure apparatus 10. The control apparatus 70 of the embodiment sets the order of exposure of each shot in the wafer WA based on the back surface temperatures measured by the temperature sensors. If the exposure light 6L is applied to one shot in the wafer WA, the temperatures of the adjacent shots also increase and the shapes of the shots deform. Therefore, the control apparatus 70 sets, as the next shot, a shot where the amount of deformation of the shot shape is within an allowable range (hereinafter referred to as the allowable deformation amount shot).

The allowable deformation amount shot may be a shot where the back surface temperature measured by a temperature sensor 16 is lower than a predetermined value. Moreover, the allowable deformation amount shot may be a shot where the amount of misalignment (amount of overlay (O/L) error) with a shot formed on a lower layer side is within an allowable range. The allowable deformation amount shots are selected in turn to determine the exposure order for the wafer WA.

The cooling gas supply tank 40 supplies cooling gas (such as $H_2$) 26 for cooling the wafer WA into the vacuum chamber 20. The cooling gas 26 is sent out to the back surfaces of the wafer WA and the Si plate 15, and the like via the cooling gas pipe. The cooling gas 26 may be sent out to the upper surface of the Si plate 15, and the like.

The coolant supply tank 50 supplies coolant 27 for cooling the wafer WA into the vacuum chamber 20. The coolant 27 is sent out to the back surface sides of the wafer WA and the Si plate 15 (the back surface sides of the wafer clamp 25 and the plate clamp 45) via the coolant pipe.

When an exposure process is performed on the wafer WA, a reticle (reflective mask) 23 is attached to reticle stage in the vacuum chamber 20. Moreover, also when the exposure process is performed on the Si plate 15, the reticle 23 is attached to the reticle stage in the vacuum chamber 20.

When the exposure process is performed in the exposure apparatus 10, the exposure light 6L is emitted from the light source 30. The exposure light 6L is then applied by the illuminating optical system 21 to the reticle 23. The exposure light 6L is reflected on the surface of the reticle 23, and transmitted to the projecting optical system 22. The exposure light 6L transmitted to the projecting optical system 22 is then guided onto the wafer stage 24.

In the exposure apparatus 10, the exposure process is performed on the Si plate 15 before the exposure process is performed on the wafer WA. The control apparatus 70 then determines the exposure order based on the back surface temperatures of the Si plate 15.

Moreover, when the exposure process is performed on the wafer WA, the wafer WA is transferred into the vacuum chamber 20 to be mounted on the wafer stage 24. The control apparatus 70 then exposes the wafer WA in the predetermined exposure order.

Figure 2:
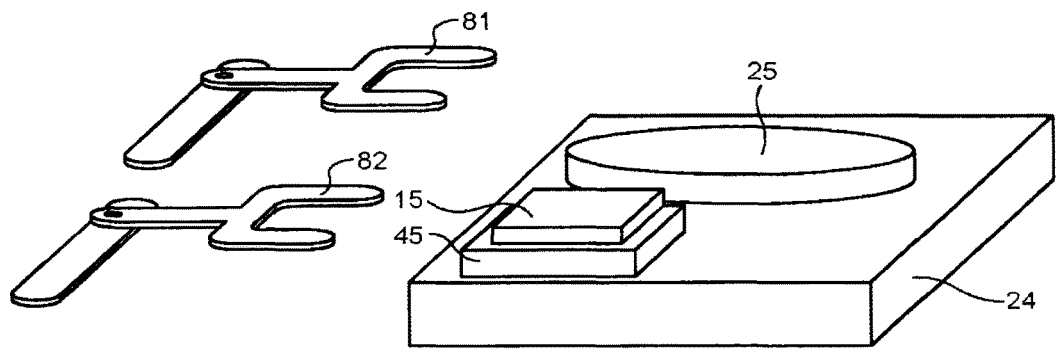
FIG. 2 is a diagram illustrating the configuration of a wafer stage.

FIG. 2 is a diagram illustrating the configuration of the wafer stage. The wafer clamp 25 and the plate clamp 45 are placed on the upper surface of the wafer stage 24. The Si plate 15 is placed on the plate clamp 45. The Si plate 15 is placed at a position where the wafer WA does not come into contact with the plate 15 when the wafer clamp 25 holds the wafer WA.

The upper surface of the Si plate 15 is substantially as high as the upper surface of the wafer WA of when the wafer clamp 25 holds the wafer WA. Moreover, the back surface of the Si plate 15 is substantially as high as the back surface of the wafer WA when the wafer clamp 25 holds the wafer WA. In this manner, the Si plate 15 and the wafer WA have substantially the same thickness. The Si plate 15 has an upper surface area equal to a plurality of shots (for example, 9 or more shots).

The Si plate 15 may be fixed and placed in advance on the wafer stage 24 or may be moved onto the wafer stage 24 by a transfer. The wafer WA is moved onto the wafer stage 24 by a transfer.

The exposure apparatus 10 includes a wafer transfer mechanism 81 having the function of transferring the wafer WA in onto the wafer stage 24 and the function of transferring the wafer WA out from on the wafer stage 24. Moreover, the exposure apparatus 10 includes a plate transfer mechanism 82 having the function of transferring the Si plate 15 in onto the plate clamp 45 and the function of transferring the Si plate 15 out from on the plate clamp 45.

If the Si plate 15 is fixed and placed in advance on the wafer stage 24, the exposure apparatus 10 may not include the plate transfer mechanism 82. Moreover, the wafer transfer mechanism 81 may transfer the wafer WA and the Si plate 15. Moreover, the plate transfer mechanism 82 may transfer the wafer WA and the Si plate 15.

Figure 3A:
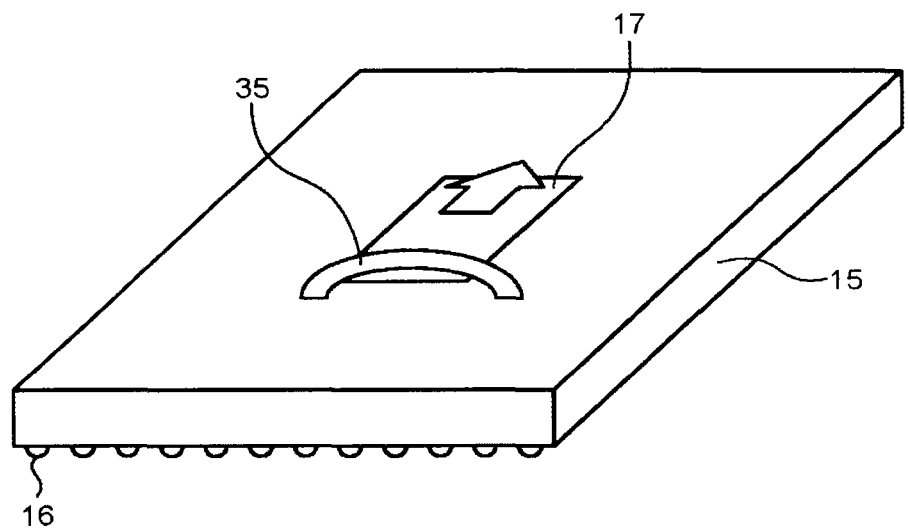
FIGS. 3A and 3B are diagrams illustrating a schematic configuration of a Si plate.
Figure 3B:
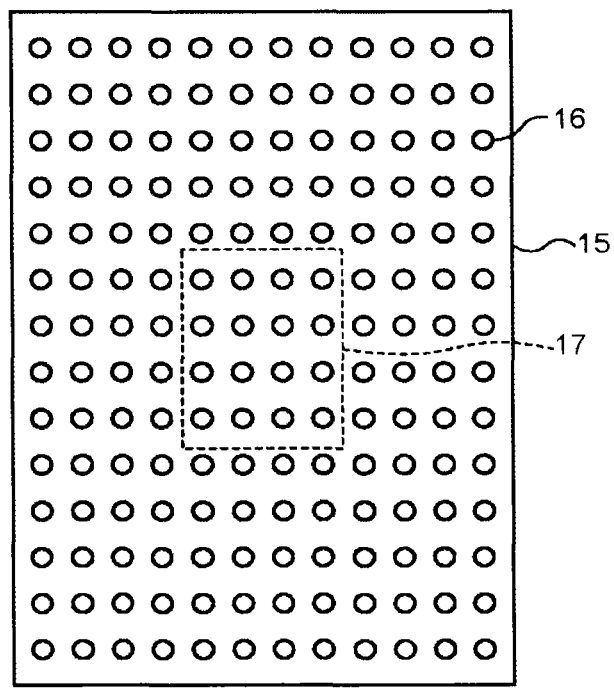

FIGS. 3A and 3B are diagrams illustrating a schematic configuration of the Si plate. FIG. 3A illustrates a perspective view of the Si plate 15 as viewed from the upper surface side. Moreover, FIG. 3B illustrates a top view of the Si plate 15 as viewed from the back surface side.

A plurality of temperature sensors 16 is placed on the back surface side of the Si plate 15. Each of the temperature sensors 16 are placed, for example, at regular intervals in a matrix form (mesh form) on the back surface of the Si plate 15. FIG. 3B illustrates a case where 14 temperature sensors 16 are arranged in the longitudinal direction and 12 in the lateral direction on the back surface of the Si plate 15. However, the number and arrangement of the temperature sensors 16 are not limited to the one illustrated in FIG. 3B.

The exposure light 6L is applied to a center area (hereinafter referred to as the center exposure area 17) of the Si plate 15 on the plate clamp 45. The back surface temperature is measured in the center exposure area 17 and around the center exposure area 17 (an outer peripheral area of the Si plate 15) (hereinafter referred to as the plate outer peripheral area) on the Si plate 15.

The temperature sensors 16 may not be placed in the center exposure area 17. In this case, the temperature sensors 16 are placed in the plate outer peripheral area on the back surface of the Si plate 15. The size and shape (rectangular area) of the center exposure area 17 are the same as a size and shape equal to one shot set for the wafer WA.

It becomes possible to easily derive the amount of deformation of the plate outer peripheral area by placing the temperature sensors 16 in the plate outer peripheral area. Therefore, it becomes possible to appropriately set the exposure order of shots corresponding to the plate outer peripheral area.

Moreover, the amounts of deformation of the center exposure area 17 can be easily derived by placing the temperature sensors 16 in the center exposure area 17.

Therefore, it becomes possible to easily correct the amounts of deformation of a shot corresponding to the center exposure area 17.

The exposure apparatus 10 performs a scan exposure on the center exposure area 17 while applying the exposure light 6L to a fan-shaped scan area 35. The temperature sensor 16 then measures the back surface temperature at the time of the completion of exposure. Moreover, the temperature sensor 16 measures the transition of the back surface temperature from the completion of exposure to when the back surface temperature falls back within an allowable range. The temperature sensor 16 transmits the measured back surface temperature to the control apparatus 70.

One that operates even in a vacuum without degassing is used as the temperature sensor 16. Moreover, it is preferred that the temperature sensor 16 has a high thermal conductivity. The temperature sensor 16 is configured using, for example, a sheathed thermocouple. The sheathed thermocouple has, for example, a structure where magnesium oxide powder or silica powder is filled in a metal protection tube (sheath). A tip portion of the temperature sensor 16 is, for example, ø 0.15.

Figure 4:
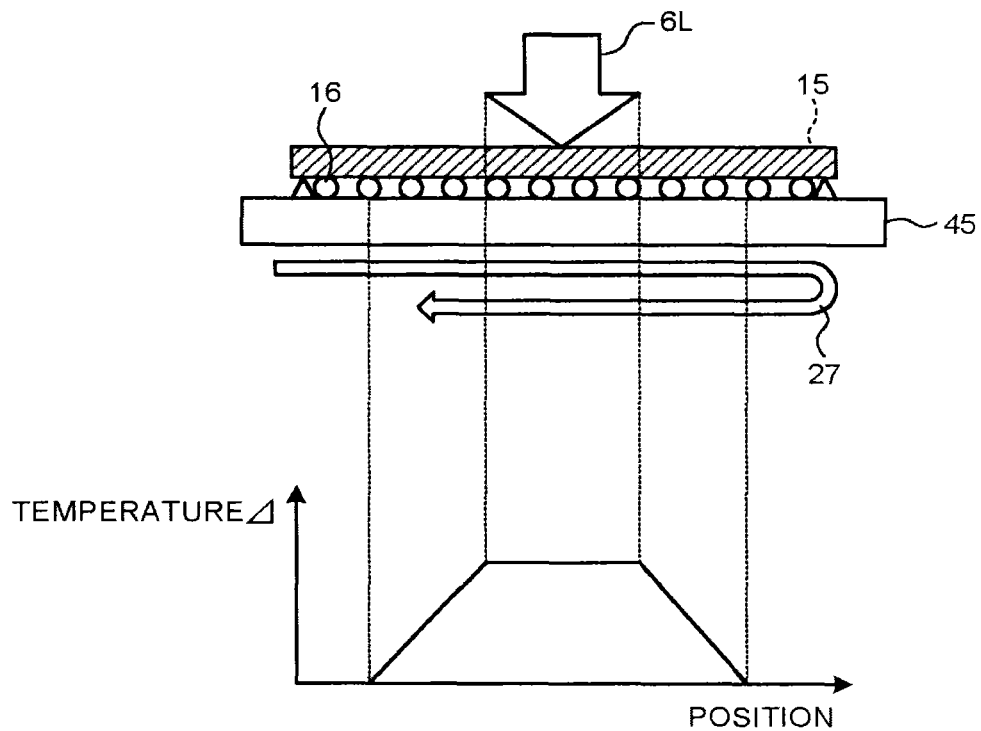
FIG. 4 is a diagram illustrating the distribution of temperature on the Si plate.

FIG. 4 is a diagram illustrating the distribution of temperature on the Si plate. FIG. 4 illustrates the relationship between cross-sectional positions on the Si plate 15 and the distribution of temperature. The Si plate 15 is held on the plate clamp 45 in a similar state to the state where the wafer WA is held on the wafer clamp 25.

The temperature sensors 16 are provided between the Si plate 15 and the plate clamp 45. The temperature sensor 16 measures the back surface temperature of the Si plate 15. When the exposure light 6L is applied to the Si plate 15, the back surface side of the wafer WA is cooled by the coolant 27 or the like.

When the exposure light 6L is applied to the center exposure area 17 of the Si plate 15, the back surface temperatures in the center exposure area 17 increase. Moreover, the back surface temperatures in the plate outer peripheral area being a portion around the center exposure area 17 increase. In the plate outer peripheral area, the shorter the distance from the center exposure area 17, the higher the increase of the back surface temperature. The back surface temperature does not increase in an area having a longer distance from the center exposure area 17 than a predetermined value.

Figure 5:
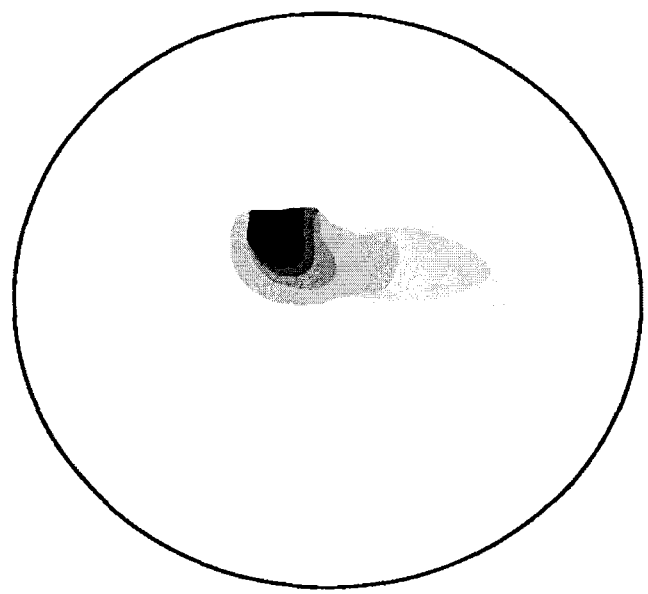
FIG. 5 is a diagram illustrating an example of the distribution of temperature on a wafer.

FIG. 5 is a diagram illustrating an example of the distribution of temperature on the wafer. FIG. 5 illustrates the distribution of temperature on the wafer WA as viewed from the upper surface side when the exposure light 6L is applied to a shot in the center of the wafer WA. The distribution of temperature illustrated in FIG. 5 is calculated by a simulation. The dark colored parts indicate high temperature parts in the distribution of temperature illustrated in FIG. 5.

When the exposure light 6L is applied to the shot in the center of the wafer WA, thermal energy by the exposure light 6L and thermal energy by infrared light ($CO_2$ laser) are generated. As a result, the back surface temperature in the center of the wafer WA increases. In this case, the shorter the distance from the exposed shot, the higher the increase of the back surface temperature. The back surface temperature does not increase in an area where the distance from the exposed shot is longer than the predetermined value.

In the embodiment, the exposure apparatus 10 measures in advance such a state of the back surface temperatures of the wafer WA with the Si plate 15. Consequently, the back surface temperatures of the wafer WA at the time when the exposure light 6L is applied to the wafer WA can be estimated. In the embodiment, an exposure order setting device 60, which is described later, of the control apparatus 70 determines the exposure order for the wafer WA based on the back surface temperatures of the wafer WA.

Figure 6:
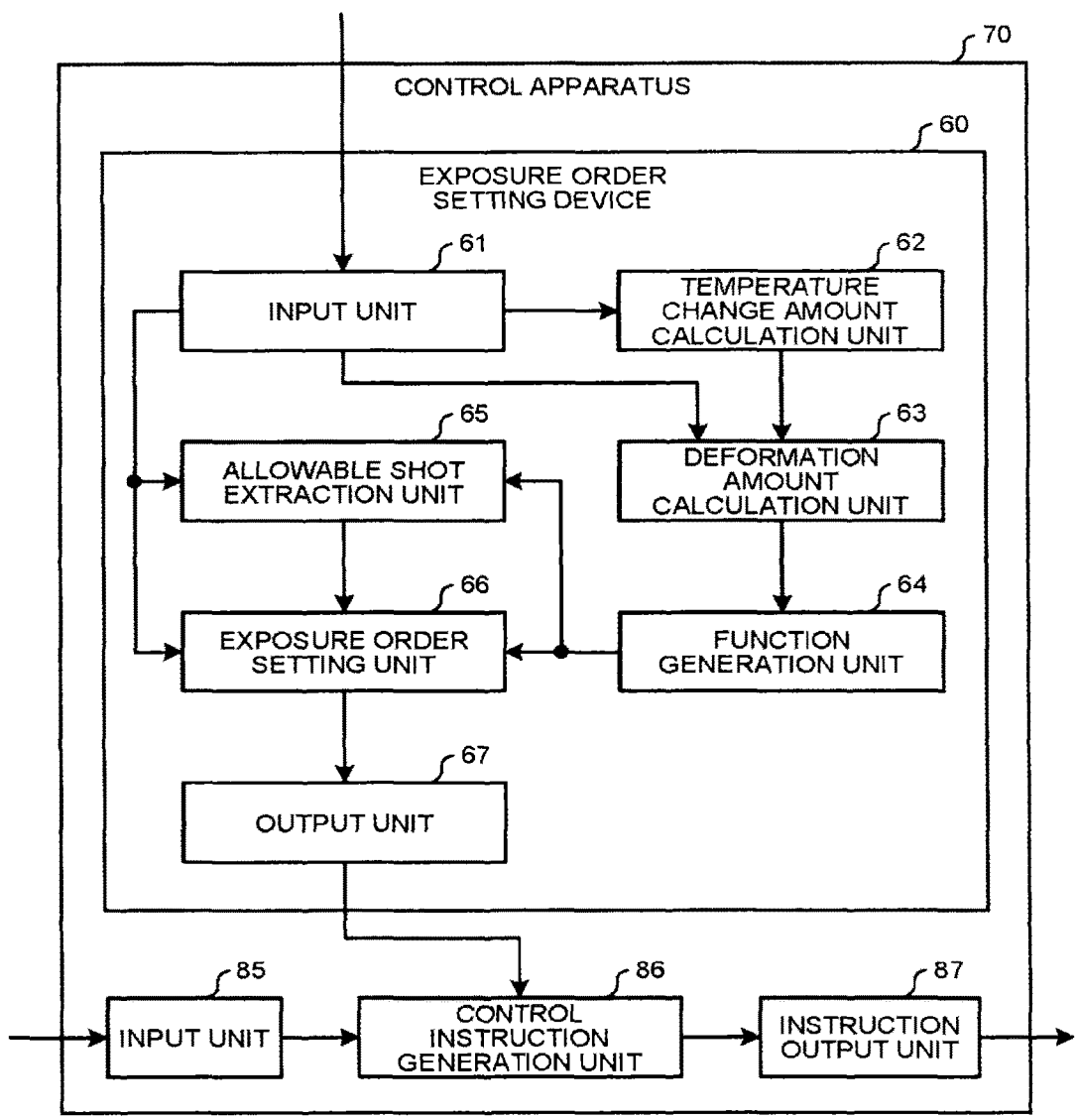
FIG. 6 is a block diagram illustrating the configuration of an exposure order setting device according to the embodiment.

FIG. 6 is a block diagram illustrating the configuration of the exposure order setting device according to the embodiment. The exposure order setting device 60 is placed in, for example, the control apparatus 70. The control apparatus 70 includes the exposure order setting device 60, an input unit 85, a control instruction generation unit 86, and an instruction output unit 87.

The exposure order setting device 60 includes a plurality of modules. The modules of the exposure order setting device 60 are an input unit (input module) 61, temperature change amount calculation unit 62, a deformation amount calculation unit 63, a function generation unit 64, an allowable shot extraction unit 65, an exposure order setting unit (setting module) 66, and an output unit 67.

Various kinds of information are input into the input unit 61. The various kinds of information may input by a user, or may be read from a memory (not illustrated) in the control apparatus 70 to be input.

The information to be input into the input unit 61 includes a shot map of the wafer WA, the thermal conductivity of the Si plate 15, the thermal expansion coefficient of the Si plate 15, the thermal conductivity of the temperature sensor 16, and exposure conditions. Moreover, the back surface temperature of the wafer WA measured by each temperature sensor 16 is input into the input unit 61. The temperature of the Si plate 15 changes after exposure. Hence, the temperature sensor 16 measures the back surface temperature of the wafer WA for a predetermined time, and continues to input the measured result into the input unit 61.

The shot map includes information on a shot size, the position of a shot, and the number of shots. Moreover, the exposure conditions include a movement speed at the time when the scan area 35 is stepped and moved from one shot to another (hereinafter referred to as the step speed). The step speed can be calculated based on the distance between shots and a step movement time. Specifically, the step speed is calculated by dividing the distance between a first shot on which a first scan process is performed and a second shot on which a second scan process is performed by the time from the completion of the first scan process to the start of the second scan process.

The input unit 61 transmits, to the temperature change amount calculation unit 62, the input thermal conductivity of the Si plate 15, thermal conductivity of the temperature sensor 16, and back surface temperature. Moreover, the input unit 61 transmits the input thermal expansion coefficient of the Si plate 15 to the deformation amount calculation unit 63. Moreover, the input unit 61 transmits the input shot map to the allowable shot extraction unit 65 and the exposure order setting unit 66.

The temperature change amount calculation unit 62 calculates the amount of change in temperature of the Si plate 15. The temperature change amount calculation unit 62 calculates the amount of change in temperature of the Si plate 15 based on the thermal conductivity of the Si plate 15, the thermal conductivity of the temperature sensor 16, and the back surface temperatures of the Si plate 15. The amount of change in temperature calculated by the temperature change amount calculation unit 62 includes a transition from the temperature of the Si plate 15 immediately after the exposure of the center exposure area 17 to the subsequent temperature of the Si plate 15. The temperature change amount calculation unit 62 calculates the amount of change in temperature at the position of each temperature sensor 16. The temperature change amount calculation unit 62 transmits the calculated amount of change in temperature to the deformation amount calculation unit 63.

The deformation amount calculation unit 63 calculates the amount of deformation of the Si plate 15 (hereinafter referred to as the plate deformation amount) based on the amount of change in temperature and the thermal expansion coefficient of the Si plate 15. The deformation amount calculation unit 63 calculates the plate deformation amount at the position of each temperature sensor 16. The plate deformation amount calculated by the deformation amount calculation unit 63 includes a transition from the plate deformation amount immediately after the exposure of the center exposure area 17 to the subsequent plate deformation amount. The deformation amount calculation unit 63 transmits the calculated plate deformation amount to the function generation unit 64.

The function generation unit 64 functionizes the relationship between a position relative to the center exposure area 17, an elapsed time after exposure, and the plate deformation amount. The position relative to the center exposure area 17 is a position (coordinate) relative to a center portion of the scan area 35 at the point, for example, when a shot exposure of the center exposure area 17 is complete.

A step movement being the movement of the scan area 35 from one step to another is performed between the scan process in a shot and the scan process in the next shot. The longer the distance from the current shot to the next shot (the longer the step movement), the step movement requires a longer time. As the step movement requires a longer time, the temperature of the Si plate 15 decreases. Accordingly, the plate deformation amount is also reduced.

Therefore, the function generation unit 64 calculates the relationship between a position relative to the center exposure area 17 and the time required to move to the position (the position/time relationship) based on the step speed and the distance from the center exposure area 17. The position relative to the center exposure area 17 is a position after the step movement. The time required to move to the position is an elapsed time after exposure. The function generation unit 64 uses the position/time relationship to functionize the relationship between a position relative to the center exposure area 17, an elapsed time after exposure, and the plate deformation amount.

In other words, the function generation unit 64 uses the step speed to generate a function indicating the relationship between a position relative to the center exposure area 17 and the transition of the plate deformation amount after exposure. The function generation unit 64 transmits the generated function to the allowable shot extraction unit 65 and the exposure order setting unit 66.

The allowable shot extraction unit 65 extracts allowable deformation amount shots based on the shot map and the generated function. The allowable shot extraction unit 65 transmits the extracted allowable deformation amount shots to the exposure order setting unit 66.

The exposure order setting unit 66 sets the exposure order of each shot in the wafer WA based on the shot map and the allowable deformation amount shots. The exposure order setting unit 66 sets the exposure order after setting an interval time if the exposure order cannot be set in such a manner as that all the shots become an allowable deformation amount shot in turn. In this case, the exposure order setting unit 66 is required to set an interval only for a shot that requires an interval. The exposure order setting unit 66 transmits the set exposure order to the output unit 67. The output unit 67 transmits the exposure order to the control instruction generation unit 86.

The shot map, exposure conditions, and the like are input into the input unit 85 of the control apparatus 70. The exposure conditions to be input into the input unit 85 include, for example, exposure energy (the amount of energy per unit time: mj/cm$^2$). The shot map and the exposure conditions may be stored in advance in the control apparatus 70, and information specifying a shot map and exposure conditions may be input into the input unit 85.

The input unit 85 transmits the shot map and the exposure conditions to the control instruction generation unit 86. The control instruction generation unit 86 generates an exposure instruction in accordance with the shot map, the exposure conditions, and the exposure order and transmits the exposure instruction to the instruction output unit 87. The instruction output unit 87 transmits the exposure instruction to devices in the vacuum chamber 20.

The exposure apparatus 10 transmits an exposure instruction of the same exposure conditions to a component in the vacuum chamber when the Si plate 15 is exposed and when the wafer WA is exposed. The exposure conditions transmitted out by the exposure apparatus 10 include at least one of exposure energy, a shot size, an illumination condition, the type of reticle, and a cooled state.

Next, a description is given of a procedure for an exposure order setting process according to the embodiment. FIG. 7 is a flowchart illustrating the procedure for the exposure order setting process according to the embodiment. Various films are laminated on the wafer WA. Accordingly, when the exposure order is set for the wafer WA, the film structures of the wafer WA need to be identified in advance (Step S10).

For example, film structures of the wafer WA on the back surface side, in the middle layer, on the front surface side, and the like are identified as the film structures of the wafer WA. At this point in time, the thickness of each film, the kind (material) of film, the pattern coverage (density) of each film, the shot layout, and the like are identified. The kind of film includes, for example, a silicon substrate, a silicon nitride film, a silicon oxide film, and a metal film.

The Si plate 15 having the same film structures as the wafer WA is placed on the wafer stage 24 (Step S20). The Si plate 15 is, for example, one where various films are deposited on the silicon substrate. The plurality of temperature sensors 16 is placed on the back surface side of the Si plate 15. Furthermore, the thermal conductivity of the Si plate 15 and the thermal conductivity of the temperature sensor 16 are identified (Step S30).

In the exposure apparatus 10, the Si plate 15 is exposed under the exposure conditions of the wafer WA (Step S40). Specifically, the center exposure area 17 of the Si plate 15 is exposed with the same exposure energy, shot size, illumination condition, reticle, and cooled state as the exposure conditions of the wafer WA.

The temperature sensors 16 then measure the back surface temperature of the Si plate 15 during and after the exposure process (Step S50). For example, each temperature sensor 16 measures the back surface temperature at predetermined timings during the exposure process. Moreover, each temperature sensor 16 measures the back surface temperature at predetermined timings between after the completion of the exposure process and until the passage of a predetermined time. The back surface temperatures are measured by the temperature sensors 16 in the center exposure area 17 and the plate outer peripheral area on the back surface of the Si plate 15.

When the wafer WA is exposed, an up scan or down scan is performed on a shot by shot basis. Therefore, the temperature sensor 16 may measure both the back surface temperature at the time when the up-scan exposure is performed on the Si plate 15 and the back surface temperature at the time when the down-scan exposure is performed on the Si plate 15. Each temperature sensor 16 transmits the measured back surface temperatures (the transition of change in temperature) to the input unit 61 to the exposure order setting device 60.

The shot map of the wafer WA, the thermal conductivity of the Si plate 15, the thermal expansion coefficient of the Si plate 15, the thermal conductivity of the temperature sensor 16, the exposure conditions, and the like are input in advance into the input unit 61. The input unit 61 transmits the input thermal conductivities and back surface temperatures to the temperature change amount calculation unit 62. Moreover, the input unit 61 transmits the input thermal expansion coefficient to the deformation amount calculation unit 63. Moreover, the input unit 61 transmits the input shot map to the allowable shot extraction unit 65 and the exposure order setting unit 66.

The temperature change amount calculation unit 62 calculates the amount of change in temperature of the Si plate 15 based on the thermal conductivity of the Si plate 15, the thermal conductivity of the temperature sensor 16, and the back surface temperatures of the Si plate 15 (Step S60). The amount of change in temperature calculated by the temperature change amount calculation unit 62 is the transition of temperature from the start of exposure. The temperature change amount calculation unit 62 transmits the calculated amount of change in temperature to the deformation amount calculation unit 63.

The deformation amount calculation unit 63 calculates the plate deformation amount at the position of each temperature sensor 16 based on the amount of change in temperature and the thermal expansion coefficient of the Si plate 15 (Step S70). The plate deformation amount is the transition of the plate deformation amount from immediately after exposure until the passage of a predetermined time. The deformation amount calculation unit 63 transmits the calculated plate deformation amount to the function generation unit 64.

The deformation amount calculation unit 63 may interpolate and calculate a change in temperature between adjacent temperature sensors 16. Moreover, if all the temperature sensors 16 detect an increase in temperature, the deformation amount calculation unit 63 may extrapolate a temperature at a position where the temperature is not measured (peripheral estimation), based on the distance from the center exposure area 17 and the distribution (gradient) of temperature on the Si plate 15.

The function generation unit 64 functionizes the relationship between a position relative to the center exposure area 17 (the next exposure position), an elapsed time after exposure, and the plate deformation amount (Step S80). The function generation unit 64 transmits the generated function to the allowable shot extraction unit 65 and the exposure order setting unit 66.

The allowable shot extraction unit 65 extracts an allowable deformation amount shot from the plate outer peripheral area based on the shot map and the perorate function (Step S90). The plate deformation amount is within the allowable range at the position of a temperature sensor 16 having the amount of change in temperature that is smaller than a predetermined value, among the temperature sensors 16. Therefore, the position of the allowable deformation amount shot relative to the center exposure area 17 corresponds to a position, from the center exposure area 17, of the temperature sensor 16 where an increase in temperature is smaller than the predetermined value.

The allowable shot extraction unit 65 may an extract allowable deformation amount shot based on the back surface temperatures. Moreover, the allowable shot extraction unit 65 may calculate the amount of misalignment between the upper and lower layers based on the plate deformation amount, and extract an allowable deformation amount shot based on the calculated value.

The allowable shot extraction unit 65 transmits the extracted allowable deformation amount shot to the exposure order setting unit 66. If having extracted a plurality of allowable deformation amount shots, the allowable shot extraction unit 65 transmits all the extracted allowable deformation amount shots to the exposure order setting unit 66.

The exposure order setting unit 66 identifies the shot map of the wafer WA (Step S100). The exposure order setting unit 66 temporarily sets the exposure order of the shots in the wafer WA based on the shot map and the allowable deformation amount shot. At this point in time, the exposure order setting unit 66 judges whether or not the exposure order can be set in such a manner as that all the shots on the wafer WA become an allowable deformation amount shot in turn (Step S110).

If the exposure order can be set in such a manner as that all the shots on the wafer WA become an allowable deformation amount shot in turn (Step S110, Yes), the exposure order setting unit 66 sets the temporarily set exposure order as the exposure order of the wafer WA (Step S120).

On the other hand, if the exposure order cannot be set in such a manner as that all the shots on the wafer WA become an allowable deformation amount shot in turn (Step S110, No), the exposure order setting unit 66 sets an interval time and then sets the exposure order (Step S130). In this case, the exposure order setting unit 66 sets an interval only for a shot that requires an interval.

The exposure order setting unit 66 transmits the set exposure order to the output unit 67. The output unit 67 transmits the exposure order to the control instruction generation unit 86. The wafer WA is subsequently exposed. Specifically, the control instruction generation unit 86 generates an exposure instruction in accordance with the shot map, the exposure conditions, and the exposure order, and transmits the exposure instruction to the instruction output unit 87. The instruction output unit 87 then transmits the exposure instruction to devices (such as the wafer stage 24) in the vacuum chamber 20. Consequently, the exposure process is performed on the wafer WA in the vacuum chamber 20 in the exposure order in accordance with the exposure instruction.

Consequently, the wafer WA can be exposed in a state where a shot targeted for exposure is not deformed. Accordingly, an exposure can be performed in a desired area. Moreover, there is no need to increase the amount of cooling gas. Accordingly, the degree of vacuum is not reduced. Moreover, there is no need to increase a contact area between the back surface side of the wafer WA and the electrostatic chuck. Accordingly, it is possible to suppress particles from being attached to the contact surface of the back surface of the wafer WA and the electrostatic chuck. Therefore, it is possible to prevent the attached particles from deforming the wafer WA upon clamping the wafer.

In this mariner, the exposure order setting device 60 of the embodiment may set the exposure order based on the back surface temperatures measured at any timing. For example, the exposure order setting device 60 may set the exposure order based on the back surface temperatures in the plate outer peripheral area immediately after the exposure of the center exposure area 17. Moreover, the exposure order setting device 60 may set the exposure order based on the transitions of the back surface temperatures in the plate outer peripheral area after the completion of the exposure of the center exposure area 17.

Figure 8A:
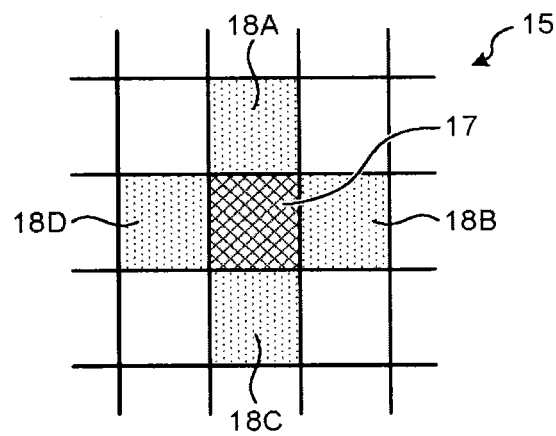
FIGS. 8A to 8C are diagrams illustrating the exposure order setting process based on allowable deformation amount shots.
Figure 8B:
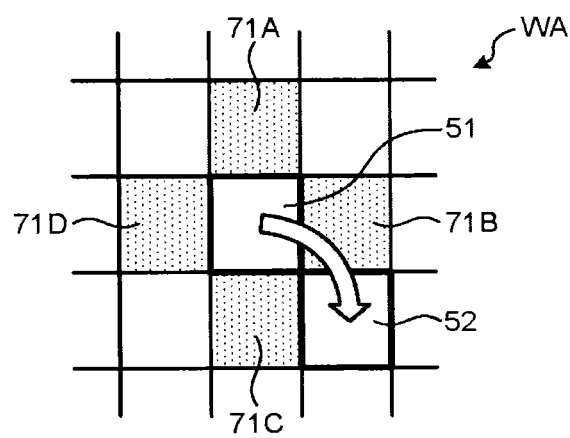
Figure 8C:
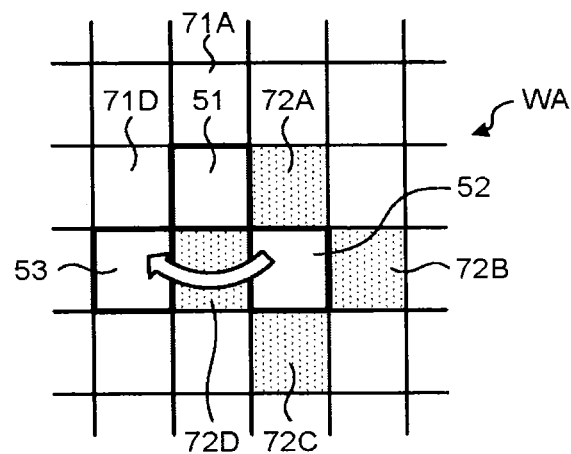

FIGS. 8A to 8C are diagrams illustrating the exposure order setting process based on allowable deformation amount shots. FIG. 8A illustrates a top view of the center exposure area 17 of the Si plate 15. For example, shots on the Si plate 15 excluding shots 18A to 18D are assumed to be allowable deformation amount shots. In the following description, shots excluding the allowable deformation amount shots are referred to as the non-allowable shots in some cases.

The shot 18A is a shot on the upper side of the center exposure area 17. The shot 18B is a shot on the right of the center exposure area 17. Moreover, the shot 18C is a shot on the lower side of the center exposure area 17. The shot 18D is a shot on the left of the center exposure area 17. In this manner, if the exposure light 6L is applied to the center exposure area 17, shots close to the center exposure area 17 become the non-allowable shot, and shots distant from the center exposure area 17 become the allowable deformation amount shot.

FIGS. 8B and 8C illustrate a top view of shots set on the wafer WA. A shot 51 illustrated in FIG. 8B is a shot corresponding to the center exposure area 17. Moreover, a shot 71A is a shot corresponding to the shot 18A. A shot 71B is a shot corresponding to the shot 18B. Moreover, a shot 71C is a shot corresponding to the shot 18C. A shot 71D is a shot corresponding to the shot 18D. Therefore, if the shot 51 is the center exposure area 17, the shots 71A to 71D are the non-allowable shots and the shots excluding the shots 71A to 71D are the allowable deformation amount shots in the plate outer peripheral area.

The exposure order setting unit 66 sets the next ((N+1)-th) shot after the shot 51 being the N-th (N is a natural number) shot is exposed. At this point in time, the exposure order setting unit 66 sets the next shot from among the allowable deformation amount shots. The exposure order setting unit 66 sets, for example, a shot close to the current shot 51 as the next shot among the allowable deformation amount shots. Consequently, it becomes possible to shorten the step movement. FIG. 8B illustrates a case where a shot 52 placed on the bottom right of the shot 51 is set as a shot exposed after the shot 51.

If an exposure is performed on the shot 52, the shot 52 becomes a shot corresponding to the center exposure area 17. As illustrated in FIG. 8C, a shot 72A is a shot on the upper side of the shot 52, and corresponds to the shot 18A. Moreover, a shot 72B is a shot on the right of the shot 52, and corresponds to the shot 18B. Moreover, a shot 72C is a shot on the lower side of the shot 52, and corresponds to the shot 18C. Moreover, a shot 72D is a shot on the left of the shot 52, and corresponds to the shot 18D. In this manner, if the shot 52 is the center exposure area 17, the shots 72A to 72D are the non-allowable shots, and the shots excluding the shots 72A to 72D are the allowable deformation amount shots in the plate outer peripheral area.

The exposure order setting unit 66 sets the (N+1)-th shot 52 and then sets the (N+2)-th shot. At this point in time, the exposure order setting unit 66 sets the next shot from among the allowable deformation amount shots. The exposure order setting unit 66 sets, for example, a shot close to the current shot 52 as the next shot among the allowable deformation amount shots. FIG. 8C illustrates a case where a shot 53 placed on the bottom left of the shot 51 is set as a shot exposed after the shot 52.

The exposure order setting unit 66 sets the exposure order for all the shots. In this case, the exposure order setting unit 66 sets an exposure order having the shortest time for the exposure of the entire wafer WA. The exposure order setting unit 66 may set an exposure order having a shorter time for the exposure of the entire wafer WA than a predetermined time.

The shots 71A and 71D may remain to be the non-allowable shots at the stage where the exposure of the shot 52 is complete. In other words, a shot that is the non-allowable shot when a shot to be exposed after the exposure of the M (M is a natural number)-th shot is set may remain to be the non-allowable shot when a shot to be exposed after the M-th shot is set. In this case, the exposure order setting unit 66 does not set the shot remaining to be the non-allowable shot as a shot to be exposed next.

Figure 9:
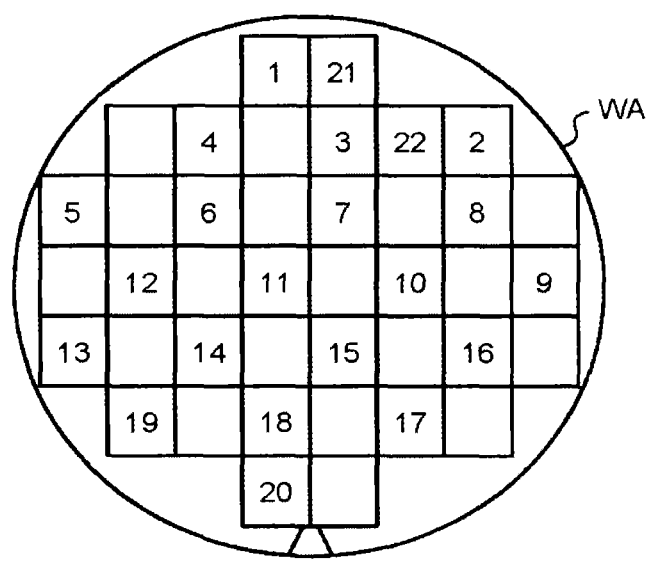
FIG. 9 is a diagram illustrating an example of an exposure order set for the wafer.

FIG. 9 is a diagram illustrating an example of the exposure order set for the wafer. Numerical values illustrated in the wafer WA of FIG. 9 represent the exposure order in the wafer WA. For example, the ninth shot to be exposed after the eighth shot is a shot on the bottom right of the eighth shot. Moreover, the tenth shot to be exposed after the ninth shot is a shot on the bottom left of the eighth shot. FIG. 9 illustrates the first to twenty-second shots. However, the twenty-third and later shots are also set in a similar procedure to the procedure described in FIG. 8.

Figure 10:
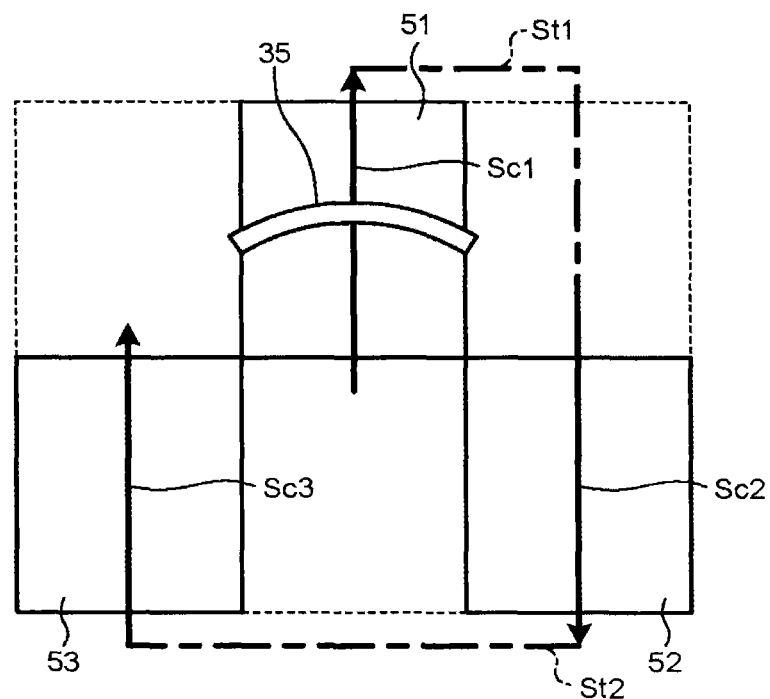
FIG. 10 is a diagram illustrating a step process and a scan process by the exposure apparatus.

FIG. 10 is a diagram illustrating a step process and a scan process by the exposure apparatus. Here, a description is given of the step and scan processes in a case of exposing the inside of the wafer WA in the order from the shots 51 to 53.

The exposure apparatus 10 performs a scan exposure in a shot by moving the scan area 35 within the shot. The exposure apparatus 10 executes a scan exposure process Sc1 on the shot 51, and subsequently executes a step process St1 of moving the scan area 35 from the shot 51 to the shot 52.

Furthermore, the exposure apparatus 10 executes a scan exposure process Sc2 on the shot 52, and subsequently executes a step process St2 of moving the scan area 35 from the shot 52 to the shot 53. The exposure apparatus 10 then executes a scan exposure process Sc3 on the shot 53, and subsequently executes the step process of moving the scan area 35 from the shot 53 to the next shot.

Upon exposure of the shot 52, the shot 52 is not deformed or expanded by the exposure of the shot 51. Similarly, upon the exposure of the shot 53, the shot 53 is not deformed or expanded by the exposure of the shots 51 and 52. Hence, an exposure with high alignment accuracy is performed.

Figure 11A:
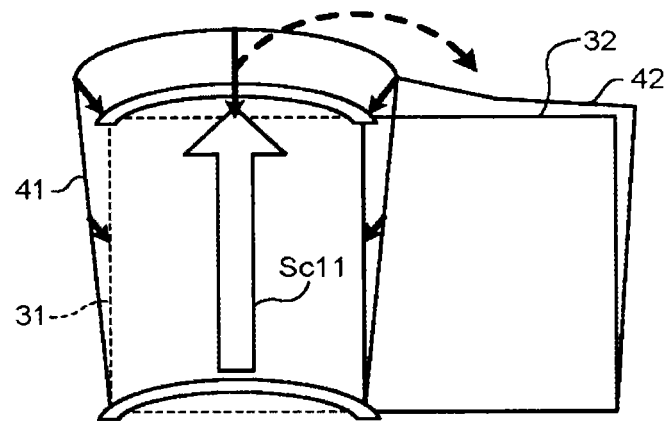
FIGS. 11A to 11C are diagrams illustrating the deformed shape of a shot under the thermal effect of an exposed shot.
Figure 11B:
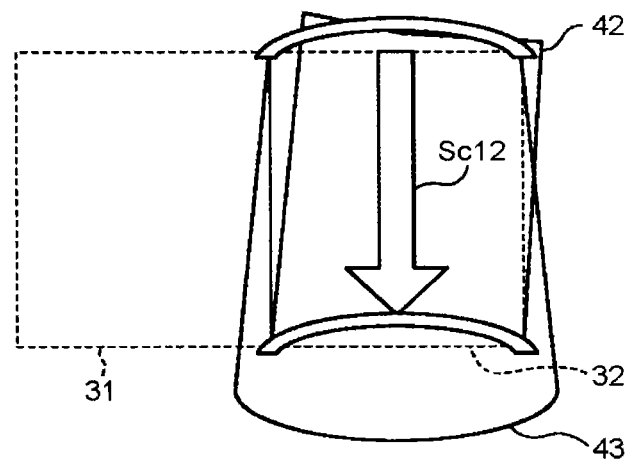
Figure 11C:
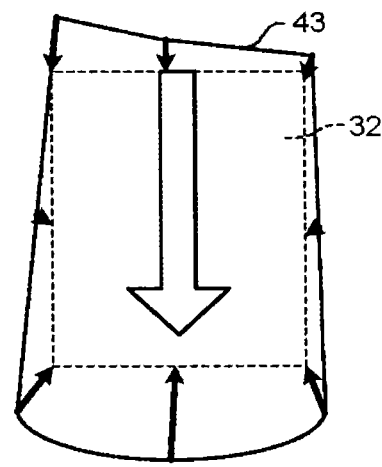

Here, a description is given of the deformed shape of a shot under the thermal effect of an exposed shot. FIGS. 11A to 11C are diagrams illustrating the deformed shape of a shot under the thermal effect of an exposed shot.

As illustrated in FIG. 11A, when a scan exposure process Sc11 is performed on a rectangular shot 31, the shot 31 is deformed into a substantially trapezoidal shot 41. Moreover, a rectangular shot 32 adjacent to the shot 31 is deformed into a shot 42 by the scan exposure process Sc11 being performed on the shot 31.

The shape of the shot 41 can be estimated. Accordingly, the shot 31 can be exposed by exposing an exposure area while correcting the exposure area. A shot that is deformed into the shot 41 can be exposed as the shot 31 by using, for example, a correction parameter such as K9 described below.

Figure 12A:
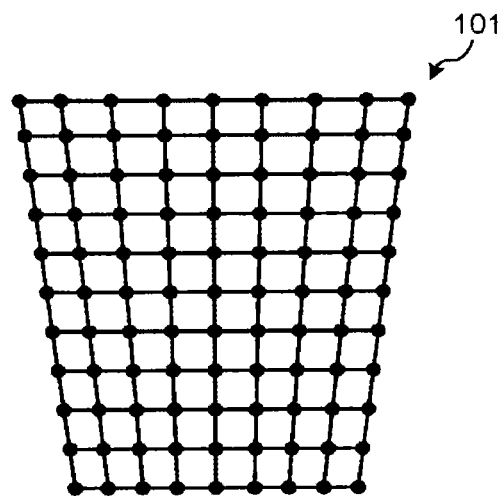
FIGS. 12A and 12B are diagrams illustrating an example of a collection parameter.
Figure 12B:
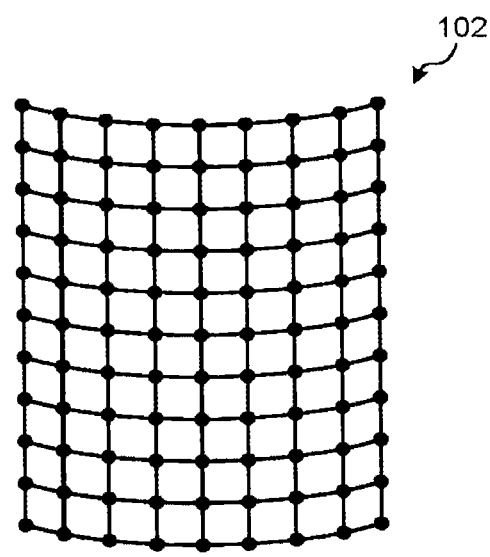

FIGS. 12A and 12B are diagrams illustrating an example of the collection parameter. A correction parameter 101 illustrated in FIG. 12A is K9. A correction parameter 102 illustrated in FIG. 12B is K12. The shape of a shot may be corrected using K9 or may be corrected using K12. Moreover, the shape of a shot may be corrected using both K9 and K12.

As illustrated in FIG. 11B, when a scan exposure process Sc12 is performed on an area of the shot 32, the shot 32 deforms. Moreover, the deformation (shot 42) caused by the scan exposure of the shot 31 remains in the area of the shot 32.

Hence, when the scan exposure process Sc12 is performed on the area of the shot 32 in a state where the shot 32 deforms as in the shot 42, it becomes a shot 43 of a deformed shape caused by combining the deformation due to the scan exposure process Sc12 and the remaining deformation.

As illustrated in FIG. 11C, the shot 43 has a complicated deformed shape. Accordingly, it is difficult to make a correction estimating this deformed shape. If the shot 32 deforms as in the shot 43, when an upper layer than the shot 43 is patterned, alignment with the shot 43 becomes difficult. Moreover, it is difficult to align the shot 43 with a lower layer side than the shot 43.

In the embodiment, an exposure is performed on an allowable deformation amount shot where the amount of deformation of a shot is smaller than a predetermined value. Accordingly, alignment between the upper and lower layers can be performed easily. The actual amount of misalignment in the wafer WA may be measured to correct alignment with the upper layer based on the measurement result. Moreover, even if the allowable deformation amount shot is exposed, the shape of the shot may deform. Accordingly, an exposure may be performed in such a manner as to correct the shape of the shot. In this case, the shape of the shot is corrected for, for example, each shot to be exposed.

Figure 13A:
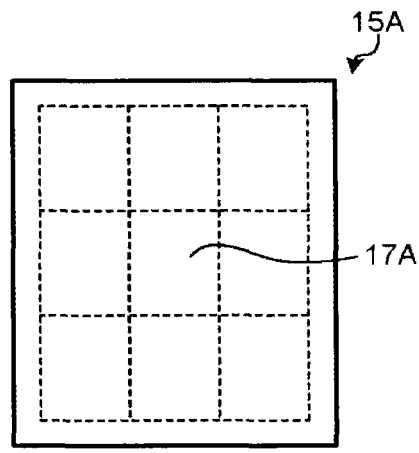
FIGS. 13A to 13C are diagrams illustrating a specific configuration example of the Si plate.
Figure 13B:
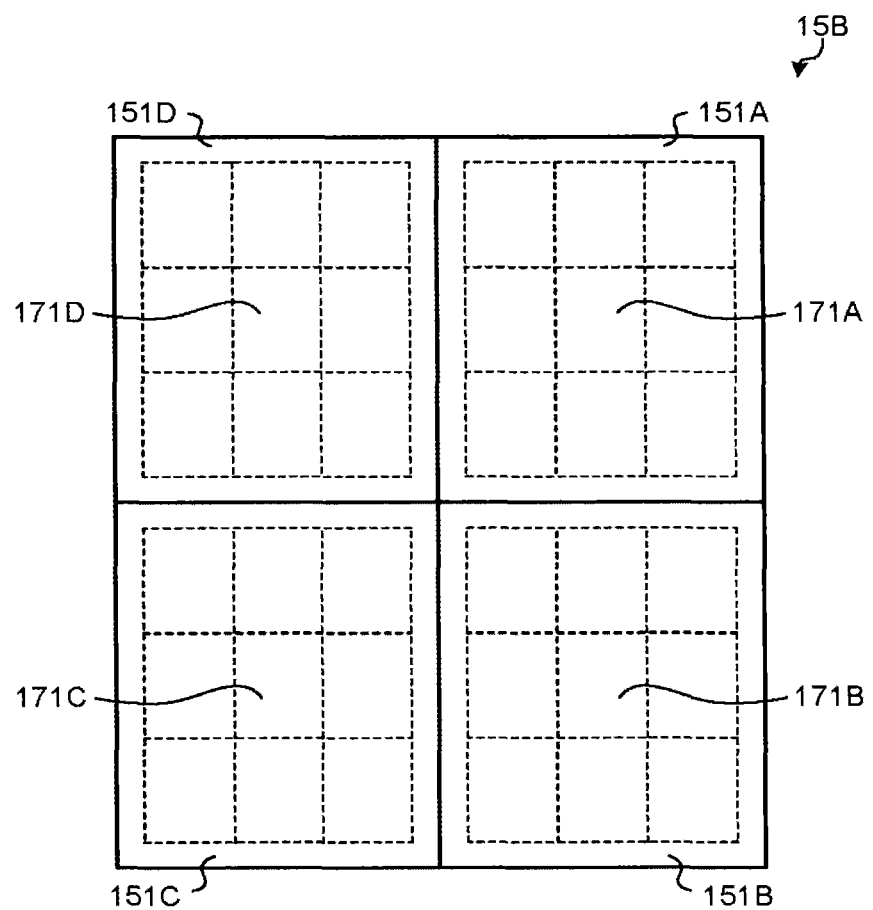
Figure 13C:
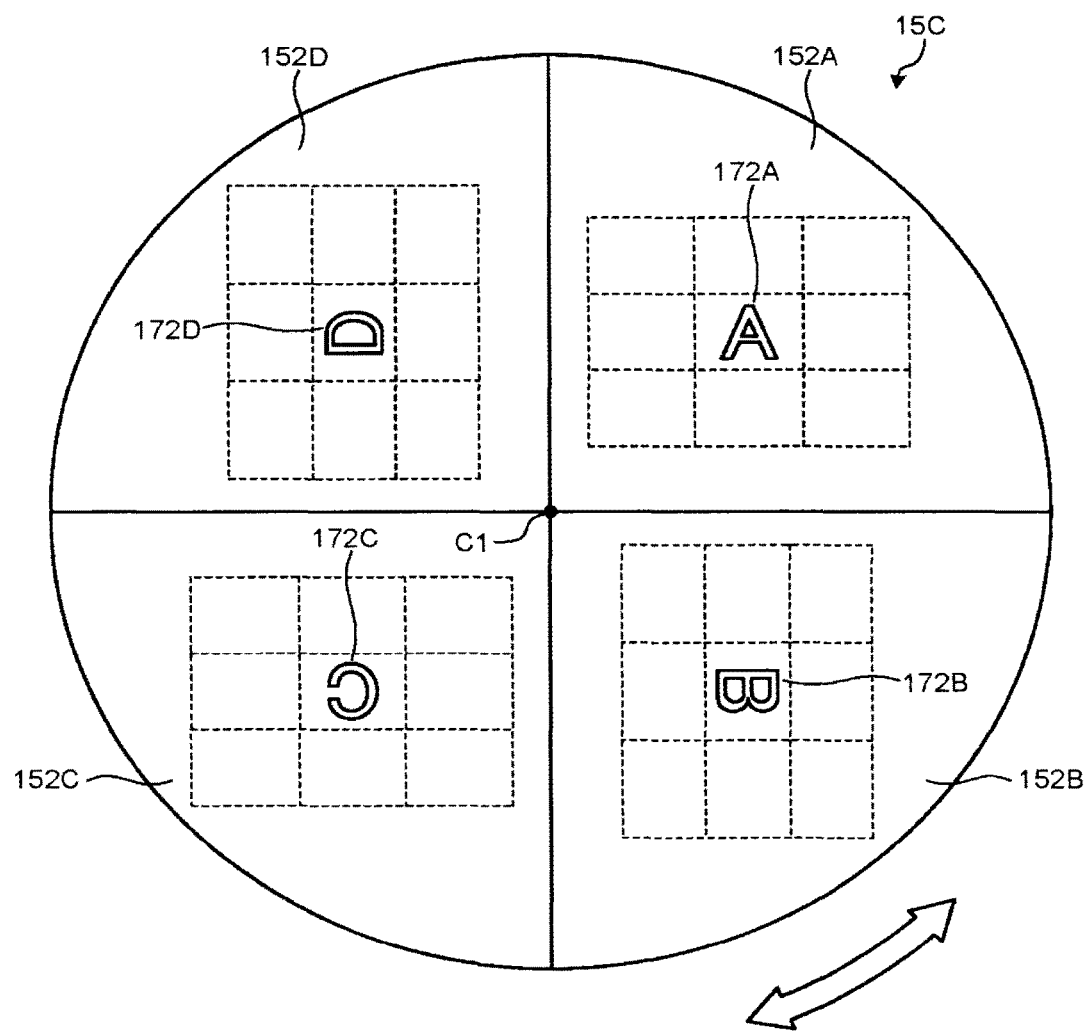

FIGS. 13A to 13C are diagrams illustrating a specific configuration example of the Si plate. FIG. 13A is a diagram illustrating a first example of the Si plate. As illustrated in the diagram, a Si plate 15A has an upper surface of a rectangular shape, and includes, for example, an area equal to nine shots. Specifically, the Si plate 15A includes a shot of a center exposure area 17A and eight shots (the plate outer peripheral area) adjacent to the center exposure area 17A.

FIG. 13B is a diagram illustrating a second example of the Si plate. As illustrated in the diagram, a Si plate 15B has an upper surface of a rectangular shape, and includes, for example, four types of Si plate areas 151A to 151D. The Si plate areas 151A to 151D each have a different film structure (for example, the top layer film on the lower layer side of resist). For example, the top layer film on the lower layer side of the resist is a silicon nitride film in the Si plate area 151A. The top layer film on the lower layer side of the resist is a metal film in the Si plate 151B area.

The Si plate areas 151A to 151D each include, for example, an area equal to nine shots as in the Si plate 15A. Specifically, the Si plate area 151A includes a shot of a center exposure area 171A and eight shots adjacent to the center exposure area 171A. Moreover, the Si plate area 151B includes a shot of a center exposure area 171B and eight shots adjacent to the center exposure area 171B. Moreover, the Si plate area 151C includes a shot of a center exposure area 171C and eight shots adjacent to the center exposure area 171C. Moreover, the Si plate area 151D includes a shot of a center exposure area 171D and eight shots adjacent to the center exposure area 171D.

FIG. 13C is a diagram illustrating a third example of the Si plate. As illustrated in the diagram, a Si plate 15C includes, for example, four types of Si plate areas 152A to 152D. The Si plate 15C has an upper surface of a circular area, and rotates the Si plate areas 152A to 152D with a revolver type rotating mechanism.

For example, if the Si plate area 152D is used, the Si plate 15C is rotated around a center C1 in the plane of the plate to move the Si plate are 152A to the exposure position. Moreover, if the Si plate area 152B is used, the Si plate 15C is rotated around the center C1 in the plane of the plate to move the Si plate are 152B to the exposure position.

The Si plate areas 152A to 152D include similar areas to the Si plate areas 151A to 151D. Each of the Si plate areas 152A to 152D respectively include a shot of its center exposure area 172A, 172B, 172C, or 172D and eight shots adjacent to the above center exposure area 172A, 172B, 172C, or 172D.

The Si plates 15A and 15B may have an upper surface of a circular shape. Moreover, the Si plate 15C may have an upper surface of a rectangular shape. Moreover, the Si plate 15A may include 25 or 36 shots, not be limited to nine shots. Moreover, the Si plate areas 151A to 151D and 152A to 152D may include 25 or 36 shots, not be limited to nine shots.

Moreover, any of the Si plates 15A to 15C may be transferred into the vacuum chamber 20 to be used. In this case, the plate clamp 45 on which the temperature sensors 16 are placed is formed in the vacuum chamber 20. The exposure process is performed on any of the Si plates 15A to 15C in the state where the plate clamp 45 holds the Si plate 15A, 158, or 15C. The Si plate 15A, 15B, or 15C is transferred out if necessary and another Si plate 15A, 15B, or 15C is transferred in if necessary.

The exposure order is set by the exposure order setting device 60 for, for example, each layer of the wafer process. Upon manufacture of a semiconductor device, the exposure order setting device 60 sets the exposure order of the wafer WA using the Si plate 15. At this point in time, the exposure order setting device 60 sets the exposure order of the wafer WA for each film structure of the wafer WA.

Various films are deposited on the wafer WA. The wafer WA to which resist has been applied is transferred into the exposure apparatus 10. The exposure apparatus 10 exposes the wafer WA in the preset exposure order. At this point in time, the exposure apparatus 10 exposes the wafer WA in the exposure order in accordance with the film structure of the wafer WA.

The wafer WA is subsequently developed to form a resist pattern on the wafer WA. A lower layer side of the resist pattern is etched using the resist pattern as a mask. Consequently, an actual pattern corresponding to the resist pattern is formed on the wafer WA. Upon manufacture of a semiconductor device, the film deposition process, the exposure process, the development process, the etching process, and the like are repeated on a layer by layer basis.

Figure 14:
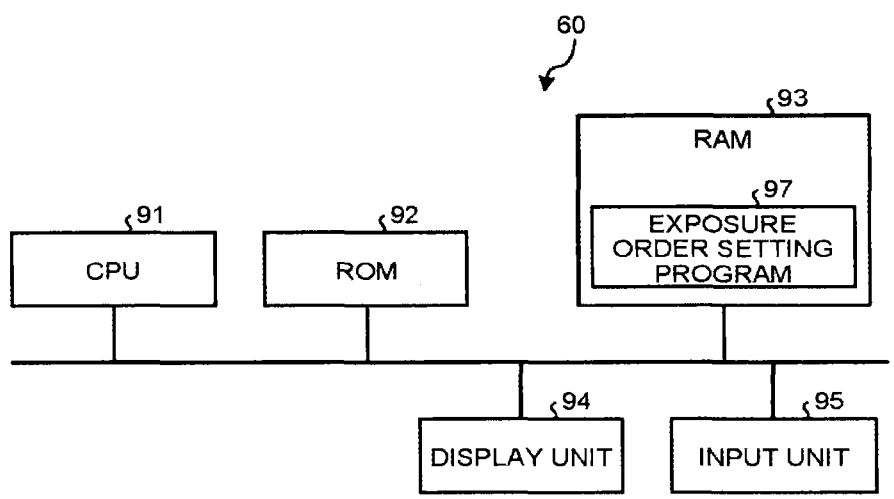
FIG. 14 is a diagram illustrating a hardware configuration of the exposure order setting device.

Next, a hardware configuration of the exposure order setting device 60 is described. FIG. 14 is a diagram illustrating a hardware configuration of the exposure order setting device. The exposure order setting device 60 includes a Central Processing Unit (CPU) 91, a Read Only Memory (ROM) 92, a Random Access Memory (RAM) 93, a display unit 94, and an input unit 95. In the exposure order setting device 60, these CPU 91, ROM 92, RAM 93, display unit 94, and input unit 95 are connected via a bus line.

The CPU 91 determines a pattern using an exposure order setting program 97 being a computer program. The exposure order setting program 97 is a computer executable computer program product including a non-transitory, computer readable recording medium (nontransitory computer readable medium) having a plurality of commands for setting the exposure order. The exposure order setting program 97 causes a computer to execute the setting of the exposure order by the plurality of commands.

The display unit 94 is a display device such as a liquid crystal monitor, and displays the shot map of the wafer WA, the exposure conditions, the temperature measured by the temperature sensor 16, the amount of change in temperature of the Si plate 15, the exposure order, the interval time, and the like, based on an instruction of the CPU 91. The input unit 95 is configured including a mouse and a keyboard, and inputs instruction information such as a parameter necessary to set the exposure order) to be externally input by the user. The instruction information, which has been input into the input unit 95, is transmitted to the CPU 91.

The exposure order setting program 97 is stored in the ROM 92 and is loaded into the RAM 93 via the bus line. FIG. 14 illustrates a state where the exposure order setting program 97 has been loaded into the RAM 93.

The CPU 91 executes the exposure order setting program 97 loaded into the RAM 93. Specifically, in the exposure order setting device 60, the CPU 91 reads the exposure order setting program 97 from the ROM 92 in accordance with the input of the instruction by the user from the input unit 95 and expands the exposure order setting program 97 in a program storage area in the RAM 93 to execute various processes. The CPU 91 temporarily stores various kinds of data occurring upon the various processes in the data storage area formed in the RAM 93.

The exposure order setting program 97 to be executed by the exposure order setting device 60 has a module configuration including the temperature change amount calculation unit 62, the deformation amount calculation unit 63, the function generation unit 64, the allowable shot extraction unit 65, and the exposure order setting unit 66. They are loaded onto a main storage device, and generated on the main storage device.

In the embodiment, the case where the exposure apparatus 10 uses the exposure light 6L for exposure was described. However, the exposure apparatus 10 may perform exposures using exposure light other than the exposure light 6L. Moreover, in the embodiment, the case where the exposure apparatus 10 performs exposures in the vacuum chamber 20 was described. However, the exposure apparatus 10 may perform exposures in a chamber other than the vacuum chamber 20.

Moreover, in the embodiment, the case where the exposure apparatus 10 cools the back surfaces of the wafer WA and the Si plate 15 was described. However, the exposure apparatus 10 may adjust the temperature of the back surfaces of the wafer WA and the Si plate 15.

In this manner, according to the embodiment, the exposure apparatus 10 applies the exposure light 6L to the Si plate 15 having the same film structures to those of the wafer WA, and the temperature sensors 16 measure the back surface temperatures of the wafer WA. The exposure order setting device 60 then sets the exposure order for the wafer WA based on the back surface temperatures.

Consequently, a shot can be subsequently exposed without the thermal effect of an exposed shot. Therefore, the wafer WA can be exposed with no deformation and expansion. Accordingly, the exposure process can be achieved which suppresses the deformation of the wafer WA. As a result, it is possible to obtain an effect that can improve the accuracy of alignment of exposure positions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure apparatus comprising:
a wafer stage configured to mount a wafer thereon;
an irradiation optical system configured to apply exposure light to a reticle;
a projecting optical system configured to guide the exposure light onto the wafer stage; and
an exposure order setting device configured to set an exposure order of shots in the wafer, based on a back surface temperature of a silicon plate, wherein
the wafer stage includes
a wafer clamp configured to hold the wafer, and
a plate clamp configured to hold the silicon plate having a predetermined film formed on a silicon substrate, the plate clamp including a plurality of temperature sensors placed on an upper surface side thereof to measure a back surface temperature of the silicon plate,
the projecting optical system applies the exposure light to the silicon plate on the plate clamp upon exposure of the silicon plate, and applies the exposure light to the wafer on the wafer clamp upon exposure of the wafer,
the temperature sensors measure a transition of the back surface temperature after completion of exposure of an irradiation area to which the exposure light is applied, and
the exposure order setting device calculates a transition of an amount of deformation of the silicon plate corresponding to an elapsed time after exposure based on the transition of the back surface temperature, uses a movement speed upon an area to which the exposure light is applied stepping and moving between shots to generate a function indicating a relationship between a position of the temperature sensors for the irradiation area and the transition of the amount of deformation of the silicon plate, extracts shots where the amount of deformation is within an allowable range based on the function, and sets any of the extracted shots as a shot of a next exposure target.

2. The exposure apparatus according to claim 1, wherein the exposure order setting device calculates the amount of deformation of the silicon plate based on the back surface temperature.

3. The exposure apparatus according to claim 1, wherein the exposure order setting device calculates the amount of deformation of the silicon plate based on the back surface temperature using a thermal expansion coefficient of the silicon plate.

4. The exposure apparatus according to claim 1, further comprising a transfer mechanism configured to transfer the silicon template, wherein the plate clamp holds the transferred silicon plate.

5. The exposure apparatus according to claim 1, wherein the silicon plate is fixed and placed on the plate clamp.

6. The exposure apparatus according to claim 1, wherein the silicon plate is fixed and placed on the plate clamp, and includes a plurality of types of areas including a different film structure.

7. The exposure apparatus according to claim 1, wherein the wafer stage is cooled during exposure of the wafer and during exposure of the silicon plate.

* * * * *